(12) United States Patent
Perek et al.

(10) Patent No.: US 8,543,227 B1
(45) Date of Patent: Sep. 24, 2013

(54) SENSOR FUSION ALGORITHM

(71) Applicant: Microsoft Corporation, Redmond, WA (US)

(72) Inventors: David R. Perek, Redmond, WA (US); Michael A. Schwager, Seattle, WA (US); Sharon Drasnin, Seattle, WA (US); Mark J. Seilstad, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/651,272

(22) Filed: Oct. 12, 2012

Related U.S. Application Data

(63) Continuation of application No. 13/471,202, filed on May 14, 2012.

(60) Provisional application No. 61/606,321, filed on Mar. 2, 2012, provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.
*G05B 19/18* (2006.01)

(52) U.S. Cl.
USPC ............ 700/66; 700/62; 700/59; 702/152; 702/153; 463/39

(58) Field of Classification Search
USPC .... 700/59, 62, 66; 463/36–39; 702/152–153
See application file for complete search history.

(56) References Cited

U.S. PATENT DOCUMENTS

| 578,325 | A | 3/1897 | Fleming, Andrew |
| 4,046,975 | A | 9/1977 | Seeger, Jr. |

(Continued)

FOREIGN PATENT DOCUMENTS

| EP | 2353978 | 8/2011 |
| JP | 10326124 | 12/1998 |

(Continued)

OTHER PUBLICATIONS

"Accessing Device Sensors", retrieved from <https://developer.palm.com/content/api/dev-guide/pdk/accessing-device-sensors.html> on May 25, 2012, 4 pages.

(Continued)

*Primary Examiner* — Ramesh Patel
(74) *Attorney, Agent, or Firm* — Wolfe-SBMC

(57) ABSTRACT

Sensor fusion algorithm techniques are described. In one or more embodiments, behaviors of a host device and accessory devices are controlled based upon an orientation of the host device and accessory devices, relative to one another. A combined spatial position and/or orientation for the host device may be obtained based on raw measurements that are obtained from at least two different types of sensors. In addition, a spatial position and/or orientation for an accessory device is ascertained using one or more sensors of the accessory device. An orientation (or position) of the accessory device relative to the host computing device may then be computed based on the combined spatial position/orientation for the host computing device and the ascertained spatial position/orientation for the accessory device. The relative orientation that is computed may then be used in various ways to control behaviors of the host computing device and/or accessory device.

20 Claims, 10 Drawing Sheets

(56) References Cited

U.S. PATENT DOCUMENTS

| | | | |
|---|---|---|---|
| 4,065,649 A | 12/1977 | Carter et al. | |
| 4,243,861 A | 1/1981 | Strandwitz | |
| 4,302,648 A | 11/1981 | Sado et al. | |
| 4,317,013 A | 2/1982 | Larson | |
| 4,365,130 A | 12/1982 | Christensen | |
| 4,492,829 A | 1/1985 | Rodrique | |
| 4,527,021 A | 7/1985 | Morikawa et al. | |
| 4,559,426 A | 12/1985 | Van Zeeland et al. | |
| 4,577,822 A | 3/1986 | Wilkerson | |
| 4,588,187 A * | 5/1986 | Dell | 463/47 |
| 4,607,147 A | 8/1986 | Ono et al. | |
| 4,651,133 A | 3/1987 | Ganesan et al. | |
| 4,735,394 A | 4/1988 | Facco | |
| 5,220,521 A | 6/1993 | Kikinis | |
| 5,283,559 A | 2/1994 | Kalendra et al. | |
| 5,331,443 A | 7/1994 | Stanisci | |
| 5,480,118 A | 1/1996 | Cross | |
| 5,546,271 A | 8/1996 | Gut et al. | |
| 5,548,477 A | 8/1996 | Kumar et al. | |
| 5,558,577 A * | 9/1996 | Kato | 463/36 |
| 5,681,220 A | 10/1997 | Bertram et al. | |
| 5,745,376 A | 4/1998 | Barker et al. | |
| 5,748,114 A | 5/1998 | Koehn | |
| 5,781,406 A | 7/1998 | Hunte | |
| 5,807,175 A * | 9/1998 | Davis et al. | 463/36 |
| 5,818,361 A | 10/1998 | Acevedo | |
| 5,828,770 A | 10/1998 | Leis et al. | |
| 5,874,697 A | 2/1999 | Selker et al. | |
| 5,926,170 A | 7/1999 | Oba | |
| 5,971,635 A | 10/1999 | Wise | |
| 6,002,389 A | 12/1999 | Kasser | |
| 6,005,209 A | 12/1999 | Burleson et al. | |
| 6,012,714 A | 1/2000 | Worley et al. | |
| 6,040,823 A | 3/2000 | Seffernick et al. | |
| 6,044,717 A | 4/2000 | Biegelsen et al. | |
| 6,061,644 A | 5/2000 | Leis | |
| 6,112,797 A | 9/2000 | Colson et al. | |
| 6,178,443 B1 | 1/2001 | Lin | |
| 6,254,105 B1 | 7/2001 | Rinde et al. | |
| 6,279,060 B1 | 8/2001 | Luke et al. | |
| 6,329,617 B1 | 12/2001 | Burgess | |
| 6,344,791 B1 | 2/2002 | Armstrong | |
| 6,380,497 B1 | 4/2002 | Hashimoto et al. | |
| 6,437,682 B1 | 8/2002 | Vance | |
| 6,511,378 B1 * | 1/2003 | Bhatt et al. | 463/36 |
| 6,532,147 B1 | 3/2003 | Christ, Jr. | |
| 6,543,949 B1 | 4/2003 | Ritchey et al. | |
| 6,565,439 B2 * | 5/2003 | Shinohara et al. | 463/37 |
| 6,597,347 B1 | 7/2003 | Yasutake | |
| 6,600,121 B1 | 7/2003 | Olodort et al. | |
| 6,603,408 B1 | 8/2003 | Gaba | |
| 6,617,536 B2 | 9/2003 | Kawaguchi | |
| 6,651,943 B2 | 11/2003 | Cho et al. | |
| 6,685,369 B2 | 2/2004 | Lien | |
| 6,695,273 B2 | 2/2004 | Iguchi | |
| 6,704,864 B1 | 3/2004 | Philyaw | |
| 6,721,019 B2 | 4/2004 | Kono et al. | |
| 6,725,318 B1 | 4/2004 | Sherman et al. | |
| 6,774,888 B1 | 8/2004 | Genduso | |
| 6,776,546 B2 | 8/2004 | Kraus et al. | |
| 6,781,819 B2 | 8/2004 | Yang et al. | |
| 6,784,869 B1 | 8/2004 | Clark et al. | |
| 6,813,143 B2 | 11/2004 | Makela | |
| 6,819,316 B2 | 11/2004 | Schulz et al. | |
| 6,856,506 B2 | 2/2005 | Doherty et al. | |
| 6,861,961 B2 | 3/2005 | Sandbach et al. | |
| 6,914,197 B2 | 7/2005 | Doherty et al. | |
| 6,950,950 B2 | 9/2005 | Sawyers et al. | |
| 6,970,957 B1 | 11/2005 | Oshins et al. | |
| 6,976,799 B2 | 12/2005 | Kim et al. | |
| 7,051,149 B2 | 5/2006 | Wang et al. | |
| 7,083,295 B1 | 8/2006 | Hanna | |
| 7,091,436 B2 | 8/2006 | Serban | |
| 7,106,222 B2 | 9/2006 | Ward et al. | |
| 7,123,292 B1 | 10/2006 | Seeger et al. | |
| 7,194,662 B2 * | 3/2007 | Do et al. | 714/43 |
| 7,213,991 B2 * | 5/2007 | Chapman et al. | 400/472 |
| 7,277,087 B2 | 10/2007 | Hill et al. | |
| 7,301,759 B2 | 11/2007 | Hsiung | |
| 7,447,934 B2 | 11/2008 | Dasari et al. | |
| 7,469,386 B2 * | 12/2008 | Bear et al. | 715/771 |
| 7,486,165 B2 | 2/2009 | Ligtenberg et al. | |
| 7,499,037 B2 | 3/2009 | Lube | |
| 7,502,803 B2 | 3/2009 | Culter et al. | |
| 7,542,052 B2 | 6/2009 | Solomon et al. | |
| 7,558,594 B2 | 7/2009 | Wilson | |
| 7,559,834 B1 * | 7/2009 | York | 463/2 |
| RE40,891 E | 9/2009 | Yasutake | |
| 7,636,921 B2 | 12/2009 | Louie | |
| 7,639,876 B2 | 12/2009 | Clary et al. | |
| 7,656,392 B2 | 2/2010 | Bolender | |
| 7,731,147 B2 | 6/2010 | Rha | |
| 7,733,326 B1 | 6/2010 | Adiseshan | |
| 7,777,972 B1 | 8/2010 | Chen et al. | |
| 7,782,342 B2 | 8/2010 | Koh | |
| 7,813,715 B2 | 10/2010 | McKillop et al. | |
| 7,865,639 B2 | 1/2011 | McCoy et al. | |
| 7,884,807 B2 * | 2/2011 | Hovden et al. | 345/173 |
| D636,397 S | 4/2011 | Green | |
| 7,928,964 B2 | 4/2011 | Kolmykov-Zotov et al. | |
| 7,945,717 B2 | 5/2011 | Rivalsi | |
| 7,973,771 B2 | 7/2011 | Geaghan | |
| 7,978,281 B2 | 7/2011 | Vergith et al. | |
| 8,016,255 B2 | 9/2011 | Lin | |
| 8,053,688 B2 | 11/2011 | Conzola et al. | |
| 8,065,624 B2 | 11/2011 | Morin et al. | |
| 8,069,356 B2 | 11/2011 | Rathi et al. | |
| 8,090,885 B2 | 1/2012 | Callaghan et al. | |
| 8,098,233 B2 | 1/2012 | Hotelling et al. | |
| 8,115,499 B2 | 2/2012 | Osoinach et al. | |
| 8,117,362 B2 | 2/2012 | Rodriguez et al. | |
| 8,118,274 B2 | 2/2012 | McClure et al. | |
| 8,130,203 B2 | 3/2012 | Westerman | |
| 8,154,524 B2 | 4/2012 | Wilson et al. | |
| 8,162,282 B2 | 4/2012 | Hu et al. | |
| D659,139 S | 5/2012 | Gengler | |
| 8,169,421 B2 | 5/2012 | Wright et al. | |
| 8,229,509 B2 | 7/2012 | Paek et al. | |
| 8,229,522 B2 * | 7/2012 | Kim et al. | 455/575.3 |
| 8,267,368 B2 | 9/2012 | Torii et al. | |
| 8,274,784 B2 | 9/2012 | Franz et al. | |
| 8,279,589 B2 | 10/2012 | Kim | |
| 8,322,290 B1 | 12/2012 | Mignano | |
| 8,416,559 B2 | 4/2013 | Agata et al. | |
| 8,498,100 | 7/2013 | Whitt, III et al. | |
| 2002/0134828 A1 | 9/2002 | Sandbach et al. | |
| 2003/0163611 A1 | 8/2003 | Nagao | |
| 2003/0197687 A1 | 10/2003 | Shetter | |
| 2004/0258924 A1 | 12/2004 | Berger et al. | |
| 2004/0268000 A1 | 12/2004 | Barker et al. | |
| 2005/0030728 A1 | 2/2005 | Kawashima et al. | |
| 2005/0057515 A1 | 3/2005 | Bathiche | |
| 2005/0059489 A1 | 3/2005 | Kim | |
| 2005/0146512 A1 | 7/2005 | Hill et al. | |
| 2005/0264653 A1 | 12/2005 | Starkweather et al. | |
| 2005/0264988 A1 | 12/2005 | Nicolosi | |
| 2006/0085658 A1 | 4/2006 | Allen et al. | |
| 2006/0125799 A1 | 6/2006 | Hillis et al. | |
| 2006/0154725 A1 * | 7/2006 | Glaser et al. | 463/37 |
| 2006/0156415 A1 | 7/2006 | Rubinstein et al. | |
| 2006/0181514 A1 | 8/2006 | Newman | |
| 2006/0187216 A1 | 8/2006 | Trent, Jr. et al. | |
| 2006/0195522 A1 * | 8/2006 | Miyazaki | 709/204 |
| 2007/0056385 A1 | 3/2007 | Lorenz | |
| 2007/0062089 A1 | 3/2007 | Homer et al. | |
| 2007/0069153 A1 | 3/2007 | Pai-Paranjape et al. | |
| 2007/0072474 A1 | 3/2007 | Beasley et al. | |
| 2007/0145945 A1 | 6/2007 | McGinley et al. | |
| 2007/0182663 A1 | 8/2007 | Biech | |
| 2007/0182722 A1 | 8/2007 | Hotelling et al. | |
| 2007/0200830 A1 | 8/2007 | Yamamoto | |
| 2007/0220708 A1 | 9/2007 | Lewis | |
| 2007/0234420 A1 | 10/2007 | Novotney et al. | |
| 2007/0236408 A1 | 10/2007 | Yamaguchi et al. | |

| | | |
|---|---|---|
| 2007/0236475 A1 | 10/2007 | Wherry |
| 2007/0247432 A1 | 10/2007 | Oakley |
| 2007/0260892 A1 | 11/2007 | Paul et al. |
| 2007/0283179 A1 | 12/2007 | Burnett et al. |
| 2008/0005423 A1 | 1/2008 | Jacobs et al. |
| 2008/0104437 A1 | 5/2008 | Lee |
| 2008/0151478 A1 | 6/2008 | Chern |
| 2008/0158185 A1 | 7/2008 | Westerman |
| 2008/0228969 A1 | 9/2008 | Cheah et al. |
| 2008/0238884 A1 | 10/2008 | Harish |
| 2008/0253822 A1 | 10/2008 | Matias |
| 2008/0309636 A1 | 12/2008 | Feng et al. |
| 2008/0316002 A1 | 12/2008 | Brunet et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0140985 A1 | 6/2009 | Liu |
| 2009/0195497 A1 | 8/2009 | Fitzgerald et al. |
| 2009/0231275 A1 | 9/2009 | Odgers |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0320244 A1 | 12/2009 | Lin |
| 2009/0321490 A1 | 12/2009 | Groene et al. |
| 2010/0001963 A1 | 1/2010 | Doray et al. |
| 2010/0013319 A1 | 1/2010 | Kamiyama et al. |
| 2010/0026656 A1 | 2/2010 | Hotelling et al. |
| 2010/0038821 A1 | 2/2010 | Jenkins et al. |
| 2010/0045633 A1 | 2/2010 | Gettemy et al. |
| 2010/0051432 A1 | 3/2010 | Lin et al. |
| 2010/0053534 A1 | 3/2010 | Hsieh et al. |
| 2010/0077237 A1 | 3/2010 | Sawyers |
| 2010/0085321 A1 | 4/2010 | Pundsack |
| 2010/0102182 A1 | 4/2010 | Lin |
| 2010/0103112 A1 | 4/2010 | Yoo et al. |
| 2010/0123686 A1 | 5/2010 | Klinghult et al. |
| 2010/0133398 A1 | 6/2010 | Chiu et al. |
| 2010/0142130 A1 | 6/2010 | Wang et al. |
| 2010/0149111 A1 | 6/2010 | Olien |
| 2010/0161522 A1 | 6/2010 | Tirpak et al. |
| 2010/0164857 A1 | 7/2010 | Liu et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0188299 A1 | 7/2010 | Rinehart et al. |
| 2010/0206614 A1 | 8/2010 | Park et al. |
| 2010/0222110 A1 | 9/2010 | Kim et al. |
| 2010/0231556 A1 | 9/2010 | Mines et al. |
| 2010/0250988 A1 | 9/2010 | Okuda et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0315348 A1 | 12/2010 | Jellicoe et al. |
| 2010/0325155 A1 | 12/2010 | Skinner et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0055407 A1 | 3/2011 | Lydon et al. |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0134032 A1 | 6/2011 | Chiu et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0179864 A1 | 7/2011 | Raasch et al. |
| 2011/0184646 A1 | 7/2011 | Wong et al. |
| 2011/0193787 A1 | 8/2011 | Morishige et al. |
| 2011/0205372 A1 | 8/2011 | Miramontes |
| 2011/0227913 A1 | 9/2011 | Hyndman |
| 2011/0242138 A1 | 10/2011 | Tribble |
| 2011/0248152 A1 | 10/2011 | Svajda et al. |
| 2011/0248920 A1 | 10/2011 | Larsen |
| 2011/0261001 A1 | 10/2011 | Liu |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0304577 A1 | 12/2011 | Brown |
| 2011/0316807 A1 | 12/2011 | Corrion |
| 2012/0007821 A1 | 1/2012 | Zaliva |
| 2012/0011462 A1 | 1/2012 | Westerman et al. |
| 2012/0023459 A1 | 1/2012 | Westerman |
| 2012/0024682 A1 | 2/2012 | Huang et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0075249 A1 | 3/2012 | Hoch |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113579 A1 | 5/2012 | Agata et al. |
| 2012/0117409 A1 | 5/2012 | Lee et al. |
| 2012/0127118 A1 | 5/2012 | Nolting et al. |
| 2012/0140396 A1 | 6/2012 | Zeliff et al. |
| 2012/0145525 A1 | 6/2012 | Ishikawa |
| 2012/0162693 A1 | 6/2012 | Ito |
| 2012/0175487 A1 | 7/2012 | Goto |
| 2012/0182242 A1 | 7/2012 | Lindahl et al. |
| 2012/0194448 A1 | 8/2012 | Rothkopf |
| 2012/0224073 A1 | 9/2012 | Miyahara |
| 2012/0246377 A1 | 9/2012 | Bhesania |
| 2012/0256959 A1 | 10/2012 | Ye et al. |
| 2012/0274811 A1 | 11/2012 | Bakin |
| 2012/0300275 A1 | 11/2012 | Vilardell et al. |
| 2012/0312955 A1 | 12/2012 | Randolph |
| 2013/0063873 A1 | 3/2013 | Wodrich et al. |
| 2013/0088431 A1 | 4/2013 | Ballagas et al. |
| 2013/0106766 A1 | 5/2013 | Yilmaz et al. |

FOREIGN PATENT DOCUMENTS

| | | |
|---|---|---|
| JP | 1173239 | 3/1999 |
| KR | 102011008717 | 8/2011 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", Interlink Electronics, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009), 2 pages.

"Motion Sensors", *Android Developers*, retrieved from <http://developer.android.com/guide/topics/sensors/sensors_motion.html> on May 25, 2012, 7 pages.

"Position Sensors", *Android Developers*, retrieved from <http://developer.android.com/guide/topics/sensors/sensors_position.html> on May 25, 2012, 5 pages.

"SoIRxTM E-Series Multidirectional Phototherapy ExpandableTM 2-Bulb Full Body Panel System", Retrieved from: <http://www.

solarcsystems.com/us_multidirectional_uv_light_therapy_1_intro.html > on Jul. 25, 2012,(2011), 4 pages.

"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.

Block, Steve et al., "DeviceOrientation Event Specification", *W3C, Editor's Draft*, retrieved from <https://developer.palm.com/content/api/dev-guide/pdk/accessing-device-sensors.html> on May 25, 2012,(Jul. 12, 2011), 14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch).", Retrieved from: <http://home.roadrunner.com/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/ > on May 7, 2012,(Jan. 15, 2006), 5 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.

Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.

McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.

Post, E.R. et al., "E-Broidery: Design and Fabrication of Textile-Based Computing", IBM Systems Journal, vol. 39, Issue 3 & 4,(Jul. 2000), pp. 840-860.

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.

Takamatsu, Seiichi et al., "Flexible Fabric Keyboard with Conductive Polymer-Coated Fibers", In Proceedings of Sensors 2011,(Oct. 28, 2011), 4 pages.

Zhang, et al., "Model-Based Development of Dynamically Adaptive Software", *In Proceedings of ICSE 2006*, Available at <http://www.irisa.fr/lande/lande/icse-proceedings/icse/p371.pdf>, (May 20, 2006), pp. 371-380.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, (Jan. 2013), 1 page.

"Corrected Notice of Allowance", U.S. Appl. No. 13/470,633, (Apr. 9, 2013), 2 pages.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"How to Use the iPad's Onscreen Keyboard", Retrieved from <http://www.dummies.com/how-to/content/how-to-use-the-ipads-onscreen-keyboard.html> on Aug. 28, 2012, 3 pages.

"i-Interactor electronic pen", Retrieved from: <http://www.alibaba.com/product-gs/331004878/i_Interactor_electronic_pen.html> on Jun. 19, 2012, 5 pages.

"MPC Fly Music Production Controller", *AKAI Professional*, Retrieved from: <http://www.akaiprompc.com/mpc-fly> on Jul. 9, 2012, 4 pages.

"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/471,001, (Feb. 19, 2013),15 pages.

"Non-Final Office Action", U.S. Appl. No. 13/471,139, (Mar. 21, 2013),12 pages.

"Non-Final Office Action", U.S. Appl. No. 13/471,202, (Feb. 11, 2013),10 pages.

"Non-Final Office Action", U.S. Appl. No. 13/471,336, (Jan. 18, 2013),14 pages.

"Non-Final Office Action", U.S. Appl. No. 13/651,195, (Jan. 2, 2013),14 pages.

"Non-Final Office Action", U.S. Appl. No. 13/651,232, (Jan. 17, 2013),15 pages.

"Non-Final Office Action", U.S. Appl. No. 13/651,287, (Jan. 29, 2013),13 pages.

"Non-Final Office Action", U.S. Appl. No. 13/651,304, (Mar. 22, 2013), 9 pages.

"Non-Final Office Action", U.S. Appl. No. 13/651,327, (Mar. 22, 2013), 6 pages.

"Non-Final Office Action", U.S. Appl. No. 13/651,871, (Mar. 18, 2013),14 pages.

"Non-Final Office Action", U.S. Appl. No. 13/651,976, (Feb. 22, 2013),16 pages.

"Non-Final Office Action", U.S. Appl. No. 13/653,321, (Feb. 1, 2013),13 pages.

"Non-Final Office Action", U.S. Appl. No. 13/653,682, (Feb. 7, 2013),11 pages.

"Notice of Allowance", U.S. Appl. No. 13/470,633, (Mar. 22, 2013), 7 pages.

"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.

"Reflex LCD Writing Tablets", retrieved from <http://www.kentdisplays.com/products/lcdwritingtablets.html> on Jun. 27, 2012, 3 pages.

"Restriction Requirement", U.S. Appl. No. 13/471,139, (Jan. 17, 2013), 7 pages.

"Restriction Requirement", U.S. Appl. No. 13/651,304, (Jan. 18, 2013), 7 pages.

"Restriction Requirement", U.S. Appl. No. 13/651,726, (Feb. 22, 2013), 6 pages.

"Restriction Requirement", U.S. Appl. No. 13/651,871, (Feb. 7, 2013), 6 pages.

"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.

"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.

"Tilt Shift Lenses: Perspective Control", retrieved from http://www.cambridgeincolour.com/tutorials/tilt-shift-lenses1.htm, (Mar. 28, 2008),11 Pages.

"What is Active Alignment?", http://www.kasalis.com/active_alignment.html, retrieved on Nov. 22, 2012, 2 Pages.

Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.

Qin, Yongqiang et al., "pPen: Enabling Authenticated Pen and Touch Interaction on Tabletop Surfaces", *In Proceedings of ITS 2012*, Available at <http://www.dfki.de/its2010/papers/pdf/po172.pdf>, (Nov. 2010), pp. 283-284.

Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.

Valliath, G T., "Design of Hologram for Brightness Enhancement in Color LCDs", Retrieved from <http://www.loreti.it/Download/PDF/LCD/44_05.pdf> on Sep. 17, 2012, 5 pages.

Williams, Jim "A Fourth Generation of LCD Backlight technology", Retrieved from <http://cds.linear.com/docs/Application%20Note/an65f.pdf>, (Nov. 1995), 124 pages.

"Corrected Notice of Allowance", U.S. Appl. No. 13/470,633, (Jul. 2, 2013), 2 pages.

"Final Office Action", U.S. Appl. No. 13/651,195, (Apr. 18, 2013), 13 pages.

"Final Office Action", U.S. Appl. No. 13/651,232, (May 21, 2013), 21 pages.

"Final Office Action", U.S. Appl. No. 13/651,287, (May 3, 2013), 16 pages.

"Non-Final Office Action", U.S. Appl. No. 13/563,435, (Jun. 14, 2013), 6 pages.

"Non-Final Office Action", U.S. Appl. No. 13/564,520, (Jun. 19, 2013), 8 pages.

"Non-Final Office Action", U.S. Appl. No. 13/565,124, (Jun. 17, 2013), 5 pages.

"Non-Final Office Action", U.S. Appl. No. 13/651,726, (Apr. 15, 2013), 6 pages.

"Non-Final Office Action", U.S. Appl. No. 13/651,871, (Jul. 1, 2013), 5 pages.

"Non-Final Office Action", U.S. Appl. No. 13/653,682, (Jun. 3, 2013), 14 pages.

"Non-Final Office Action", U.S. Appl. No. 13/656,055, (Apr. 23, 2013), 11 pages.

"Notice of Allowance", U.S. Appl. No. 13/471,202, (May 28, 2013), 7 pages.

"Notice of Allowance", U.S. Appl. No. 13/651,195, (Jul. 8, 2013), 9 pages.

"Notice of Allowance", U.S. Appl. No. 13/651,304, (Jul. 1, 2013), 5 pages.

"Notice of Allowance", U.S. Appl. No. 13/651,327, (Jun. 11, 2013), 7 pages.

"Notice of Allowance", U.S. Appl. No. 13/651,726, (May 31, 2013), 5 pages.

"Final Office Action", U.S. Appl. No. 13/471,001, (Jul. 25, 2013), 20 pages.

"Final Office Action", U.S. Appl. No. 13/651,976, (Jul. 25, 2013), 21 pages.

"Non-Final Office Action", U.S. Appl. No. 13/527,263, (Jul. 19, 2013), 5 pages.

"PCT Search Report and Written Opinion", Application No. PCT/US2013/029461, (Jun. 21, 2013), 11 pages.

"PCT Search Report and Written Opinion", Application No. PCT/US2013/028948, (Jun. 21, 2013), 11 pages.

* cited by examiner

SENSOR FUSION ALGORITHM

RELATED APPLICATIONS

This application is a continuation of and claims priority to U.S. patent application Ser. No. 13/471,202, filed May 14, 2012, entitled "Sensor Fusion Algorithm" and further claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. Some mobile computing devices may connect to and interact with various accessory devices to provide different input techniques, extend functionality, and so forth. One challenge that faces developers of mobile computing devices is managing behaviors and interaction with accessory devices. For instance, a host computing device may have limited control over how an accessory device behaves and thus actions of the accessory may sometimes interfere with operation of the host computing device. Moreover, the user experience may be adversely affected by accessory devices that do not respond in a manner that is consistent with the host computing device. Thus, integrated management of behaviors and interaction for accessory devices may be a challenging consideration for developers of mobile computing devices.

SUMMARY

Sensor fusion algorithm techniques are described. In one or more embodiments, behaviors of a host device and accessory devices are controlled based upon an orientation of the host device and accessory devices, relative to one another. A combined spatial position and/or orientation for the host device may be obtained based on raw measurements that are obtained from at least two different types of sensors. In addition, a spatial position and/or orientation for an accessory device is ascertained using one or more sensors of the accessory device. An orientation (or position) of the accessory device relative to the host computing device may then be computed based on the combined spatial position/orientation for the host computing device and the ascertained spatial position/orientation for the accessory device. The relative orientation that is computed may then be used in various ways to control behaviors of the host computing device and/or accessory device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Traditionally, a host computing device may have limited control over how an associated accessory device behaves. Thus actions of the accessory may sometimes interfere with operation of the host computing device, which may detract from the user experience. Accordingly, integrated management of behaviors and interaction for accessory devices may be a consideration for developers of mobile computing devices.

Sensor fusion algorithm techniques are described. In one or more embodiments, behaviors of a host device and accessory devices are controlled based upon an orientation of the host device and accessory devices, relative to one another. A combined spatial position and/or orientation for the host device may be obtained based on raw measurements that are obtained from at least two different types of sensors. In addition, a spatial position and/or orientation for an accessory device is ascertained using one or more sensors of the accessory device. An orientation (or position) of the accessory device relative to the host computing device may then be computed based on the combined spatial position/orientation for the host computing device and the ascertained spatial position/orientation for the accessory device. The relative orientation that is computed may then be used in various ways to control behaviors of the host computing device and/or accessory device.

In the following discussion, an example environment and devices are first described that may employ the techniques described herein. Example procedures are then described which may be performed in the example environment and by the devices as well as in other environments and by other devices. Consequently, performance of the example procedures is not limited to the example environment/devices and the example environment/devices are not limited to performance of the example procedures.

Example Operating Environment

Figure 1:
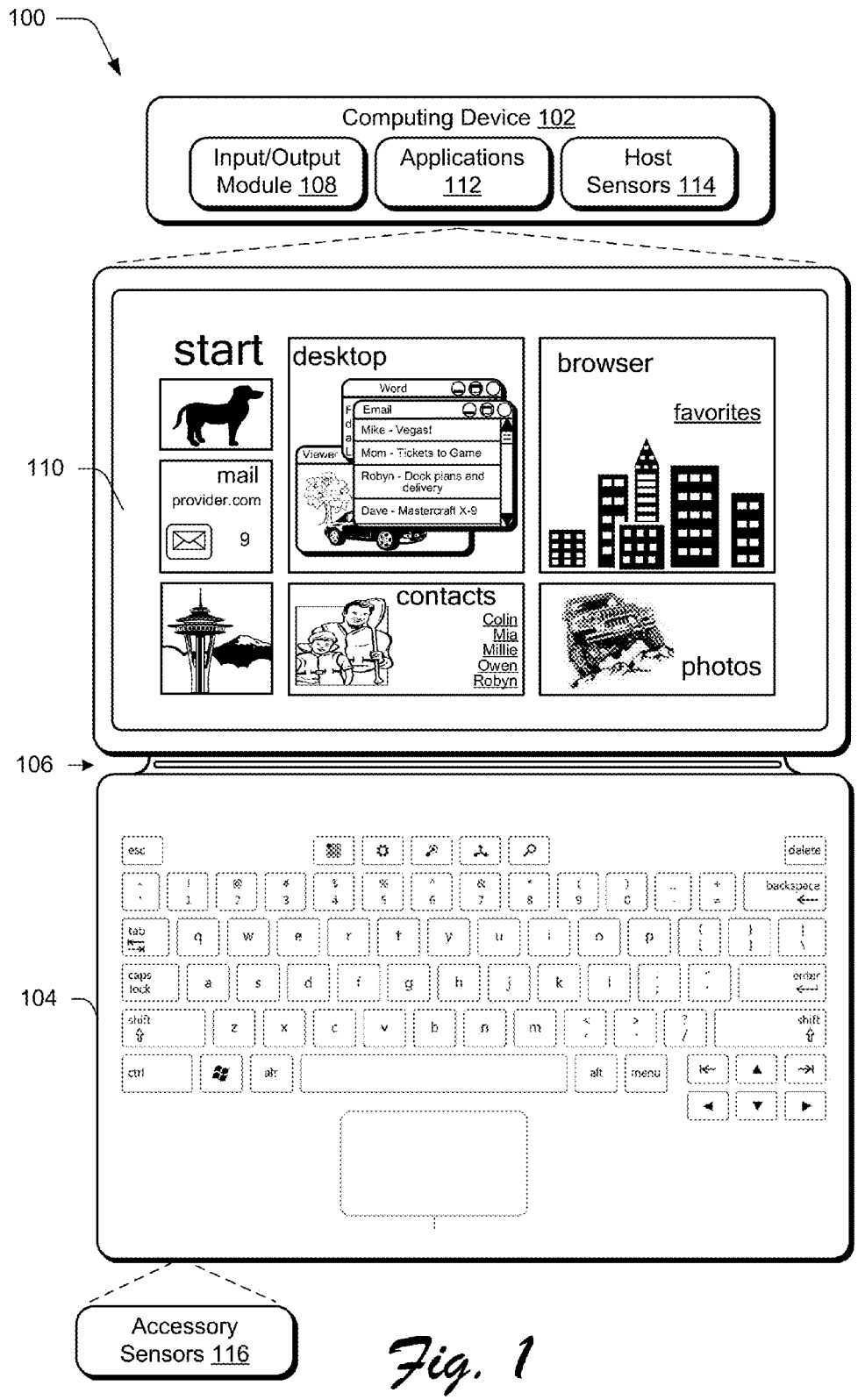
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that is physically and communicatively coupled to an accessory device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device, keys of a virtual keyboard displayed by the display device 110 to identify gestures and cause operations to be performed that correspond to the gestures that may be recognized through the accessory device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the accessory device 104 is a device configured as a keyboard having a QWERTY arrangement of keys although other arrangements of keys are also contemplated. Further, other non-conventional configurations for an accessory device 104 are also contemplated, such as a game controller, configuration to mimic a musical instrument, a power adapter, and so forth. Thus, the accessory device 104 may assume a variety of different configurations to support a variety of different functionality. Different accessory devices may be connected to the computing device at different times. Moreover, functionally of a particular accessory device may also be adapted to assume different configurations and capabilities, such as through different selectable modes, software/firmware updates, modular add-on devices/components, and so forth. This may cause changes in the way keys or other controls for an accessory are laid-out and also change the way on which inputs from the accessory are handled by the host and applications. For example, an accessory device may be operable as keyboard and as a game controller by adaptively switching the kinds of keys/controls, displayed labels, and positions of controls to assume different configurations at different times.

As previously described, the accessory device 104 is physically and communicatively coupled to the computing device 102 in this example through use of a flexible hinge 106. The flexible hinge 106 represents one illustrative example of an interface that is suitable to connect and/or attach and accessory device to a host computing device 102. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the accessory device 104 in relation to the computing device 102. This may be used to support consistent alignment of the accessory device 104 in relation to the computing device 102, such as to align sensors used to change power states, application states, and so on.

The flexible hinge 106, for instance, may be formed using one or more layers of fabric and include conductors formed as flexible traces to communicatively couple the accessory device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 or other interface may be configured in a variety of ways to support multiple different accessory devices 104, further discussion of which may be found in relation to the following figure.

As further illustrated in FIG. 1 the computing device 102 may include various applications 112 that provide different functionality to the device. A variety of applications 112 typically associated with computing devices are contemplated including, but not limited to, an operating system, a productivity suite that integrates multiple office productivity modules, a web browser, games, a multi-media player, a word processor, a spreadsheet program, a photo manager, and so forth. The computing device 102 further includes multiple host sensors 114 that are configured to sense corresponding inputs responsive to manipulation of the computing device 102. Likewise, the accessory device 104 includes one or more accessory sensors 116 that are configured to sense corresponding inputs generated responsive to manipulation of the accessory device 104.

In accordance with techniques described herein, input obtained from the host sensors 114 and accessory sensors 116 may be processed and/or combined according to a suitable sensor fusion algorithm to resolve an orientation of the accessory device 104 and computing device 102 one to another. In general, input regarding position and/or orientation from multiple different types of sensors is processed in combination to compute the orientation. The computed orientation may then be used to control behaviors of the host and accessory and perform various corresponding operations. A variety of different types of sensors and algorithms suitable to resolve the orientation may be employed as discussed in greater detail in relation to the following figures.

Figure 2:
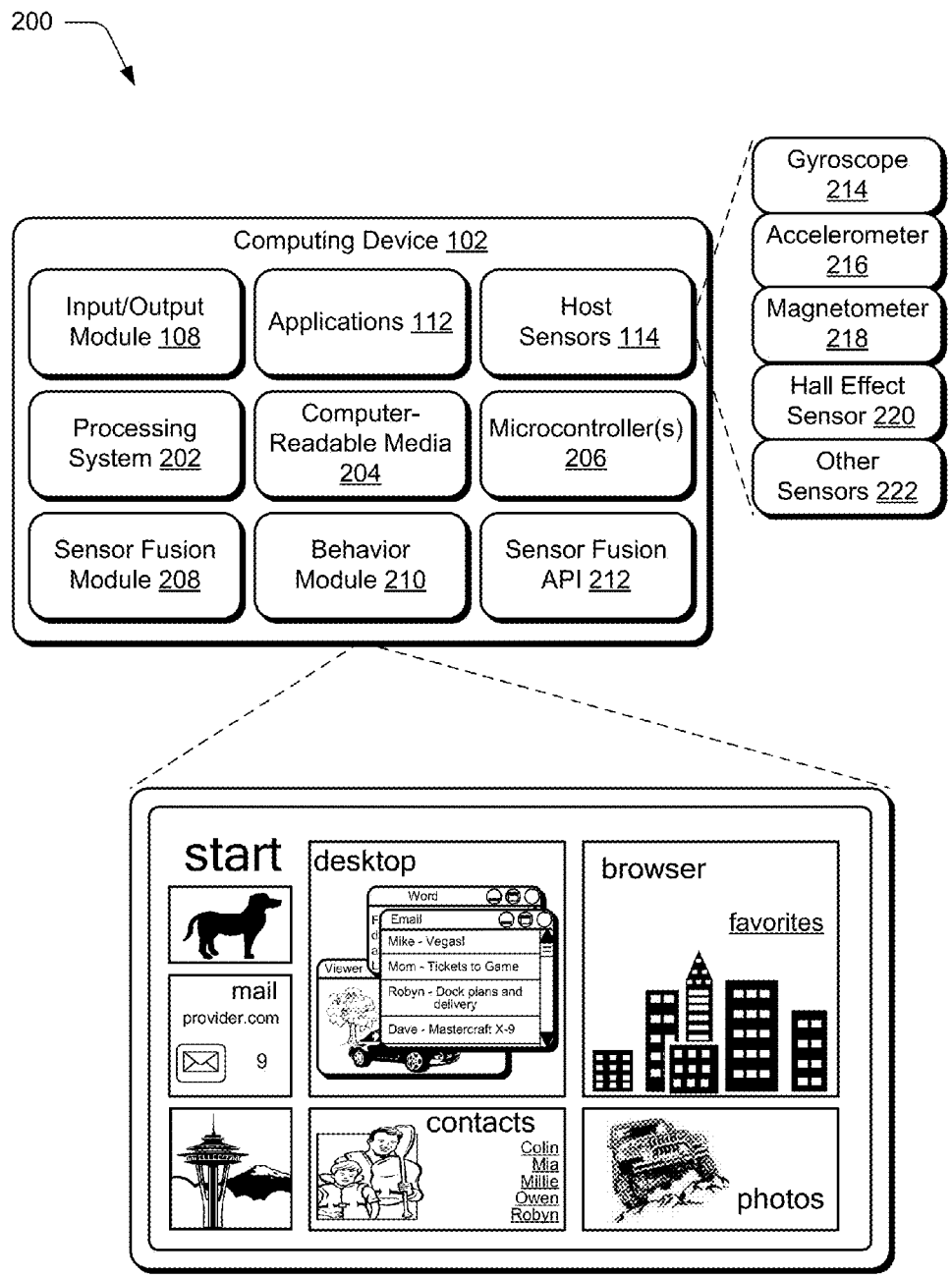
FIG. 2 depicts an example implementation of a computing device of FIG. 1 in greater detail.

To further illustrate, consider FIG. 2 which depicts generally at 200 an example computing device 102 of FIG. 1 in greater detail. In the depicted example, the computing device 102 is shown in a stand-alone configuration without an accessory device 104 being attached. In addition to the components discussed in relation to FIG. 1, the example computing device of FIG. 2 further includes a processing system 202 and computer-readable media 204 that are representative of various different types and combinations of processing components, media, memory, and storage components and/or devices that may be associated with a computing device and employed to provide a wide range of device functionality. In at least some embodiments, the processing system 202 and computer-readable media 204 represent processing power and memory/storage that may be employed for general purpose computing operations. More generally, the computing device 102 may be configured as any suitable computing system and/or device that employ various processing systems and computer-readable media, additional details and examples of which are discussed in relation to the example computing system of FIG. 13.

The computing device 102 may also implement selected device functionality through one or more microcontrollers 206. The microcontrollers 206 represent hardware devices/systems that are designed to perform a predefined set of designated tasks. The microcontrollers 206 may represent respective on-chip systems/circuits having self-contained resources such as processing components, I/O devices/peripherals, various types of memory (ROM, RAM, Flash, EEPROM), programmable logic, and so forth. Different microcontrollers may be configured to provide different embedded applications/functionality that are implemented at least partially in hardware and perform corresponding tasks. The microcontrollers 206 enable performance of some tasks outside of operation of a general purpose processing system and other applications/components of the computing device or accessory device. Generally, power consumption of the microcontrollers is low in comparison with operating a general purpose processing system for a device.

As further depicted, the computing device 102 may further include a sensor fusion module 208, a behavior module 210, and a sensor fusion application programming interface (API) 212 to implement aspects of sensor fusion algorithm techniques described herein. The sensor fusion module 208 generally represents functionality to apply a suitable sensor fusion algorithm as described above and below to derive an orientation that is based on input from multiple sensors. The sensor fusion module 208 may operate to collect inputs regarding positions/orientation/etc. supplied via the various sensors, process the inputs, and compute a corresponding orientation that describe the spatial relationship of the computing device 102 and an accessory device 104.

The behavior module 210 represents functionality to control and/or modify a variety of different behaviors associated with the computing device 102 and/or accessory devices 104 based on the computed orientation. This may include but is not limited to managing power states/consumption, selecting operational modes or device states, adjusting sensitivity of one or more sensors, controlling interaction between the host, accessory, and/or peripheral devices, modifying device functionality, enabling/disabling network connections, activating/deactivating applications, and/or setting application states, to name a few examples. These and other examples of behaviors that may be controlled based on a computed orientation are described in greater detail in relation to the example procedures discussed herein below.

The sensor fusion application programming interface (API) 212 represents functionality to expose information regarding the computer orientation for use by applications 112. For example, applications 112 may utilize the sensor fusion API to request orientation information on demand and/or subscribe to orientation updates from the sensor fusion module 208 and/or an associated notification system. The sensor fusion API may then interact with the sensor fusion module 208 on behalf of the application 112 to cause orientation information to be conveyed to the application 112. Applications 112 may use orientation information in various ways, example of which may be found in the discussion of an example procedure 1200 of FIG. 12 below.

As previously mentioned, various different types of sensors may be employed to implement the techniques described herein. A host computing device may include an array of sensors used to provide orientation information. By way of example and not limitation, the host sensors 114 for the example computing device 102 of FIG. 2 are depicted as including a gyroscope 214, an accelerometer 216, a magnetometer 218, and a Hall Effect sensor 220. Various other sensors 222 suitable to derive information regarding the position and/or orientation may also be employed.

Figure 3:
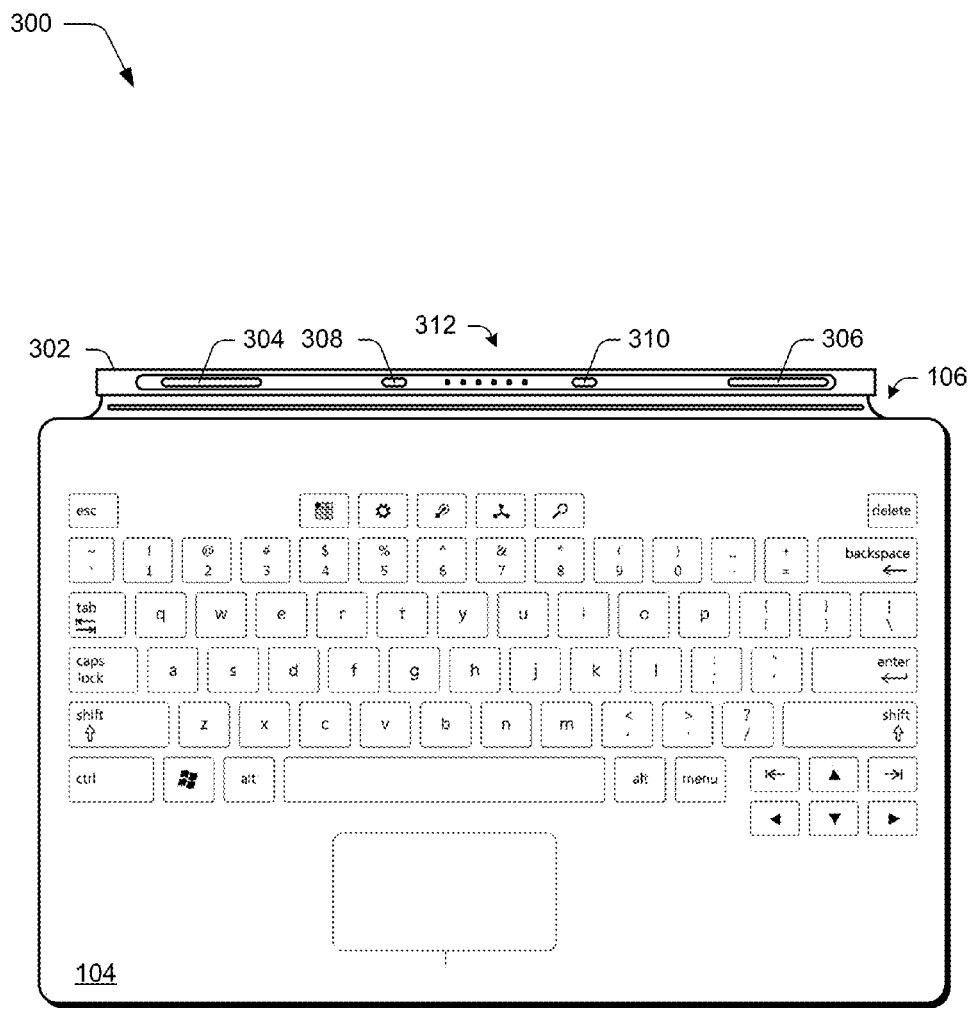
FIG. 3 depicts an example implementation of an accessory device of FIG. 1 as showing a flexible hinge in greater detail.

FIG. 3 depicts an example implementation 300 of the accessory device 104 of FIG. 1 as showing the flexible hinge 106 in greater detail. In this example, the accessory device 104 is depicted as being detached from the computing device. Here, a connection portion 302 of the input device is shown that is configured to provide a communicative and physical connection between the accessory device 104 and the computing device 102. In this example, the connection portion 302 has a height and cross section configured to be received in a channel in the housing of the computing device 102, although this arrangement may also be reversed without departing from the spirit and scope thereof. The connection portion 302 provides an interface through which attachment/connection of the accessory device 104 to the computing device may be detected. In at least some embodiments, this interface also enables communications for interaction and/or control of the accessory device 104 as described herein. For example, the computing device 102, sensor fusion module 208, and/or behavior module 210 may communicate with the accessory device through the interface to obtain input from various accessory sensors 116 and to direct behaviors of the accessory device.

The connection portion 302 is flexibly connected to a portion of the accessory device 104 that includes the keys through use of the flexible hinge 106. Thus, when the connection portion 302 is physically connected to the computing device the combination of the connection portion 302 and the flexible hinge 106 supports movement of the accessory device 104 in relation to the computing device 102 that is similar to a hinge of a book. Naturally, a variety of orientations may be supported some examples of which are described in the following section.

The connecting portion 302 is illustrated in this example as including magnetic coupling devices 304, 306, mechanical coupling protrusions 308, 310, and a plurality of communication contacts 312. The magnetic coupling devices 304, 306 are configured to magnetically couple to complementary magnetic coupling devices of the computing device 102 through use of one or more magnets. In this way, the accessory device 104 may be physically secured to the computing device 102 through use of magnetic attraction. The connecting portion 302 also includes mechanical coupling protrusions 308, 310 to form a mechanical physical connection between the accessory device 104 and the computing device 102. The communication contacts 212 are configured to contact corresponding communication contacts of the computing device 102 to form a communicative coupling between the devices to facilitate various kinds of communications.

Having discussed an example environment in which embodiments may operate, consider now some example device orientations in accordance with one or more embodiments.

Example Device Orientations

The following discussion presents some example device orientations. As detailed, different device orientations can be associated with different device power states, different application states, trigger different behaviors, and so forth. The example orientations as well as other orientations may be determined using sensor fusion algorithm techniques described above and below. A determined orientation may then be used to drive different behaviors for the host and/or the accessory.

Figure 4:
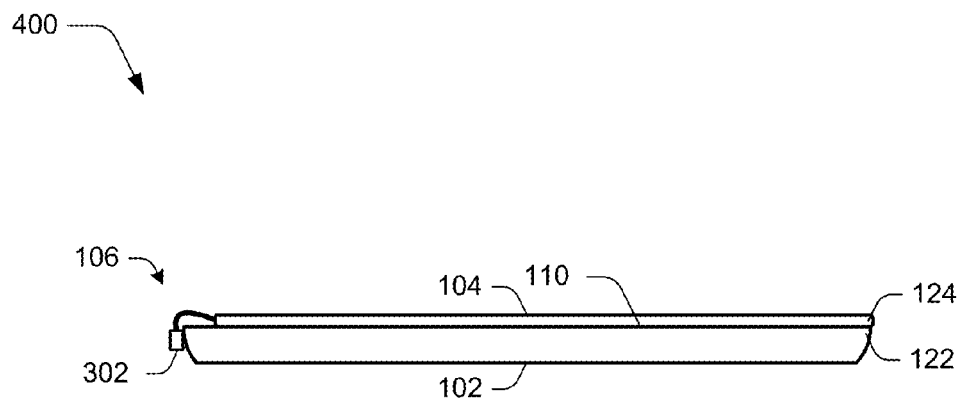
FIG. 4 depicts an example orientation of the accessory device in relation to the computing device in accordance with one or more embodiments.

FIG. 4 illustrates that the accessory device 104 may be rotated such that the accessory device 104 is placed against the display device 110 of the computing device 102 to assume an orientation 400. In the orientation 400, the accessory device 104 may act as a cover such that the accessory device 104 can protect the display device 110 from harm. In implementations, the orientation 400 can correspond to a closed position of the computing device 102.

Figure 5:
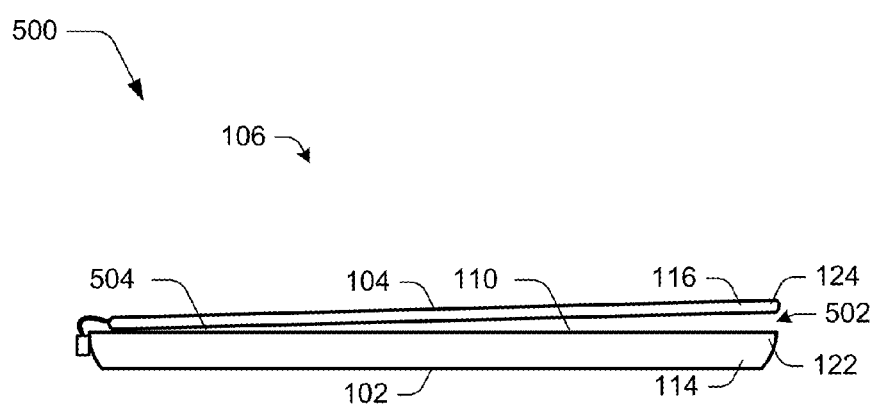
FIG. 5 depicts an example orientation of the accessory device in relation to the computing device in accordance with one or more embodiments.

FIG. 5 illustrates that the input device 104 has rotated away from the computing device 102 such that the computing device assumes an orientation 500. The orientation 400 includes a gap 502 that is introduced between the computing device 102 and the accessory device 104. In implementations, the orientation 500 can be caused unintentionally by a user, such as by inadvertent contact with the computing device 102 and/or the accessory device 104 that causes the computing device 102 to sag slightly away from the accessory device 104 such that the gap 502 is introduced.

Figure 6:
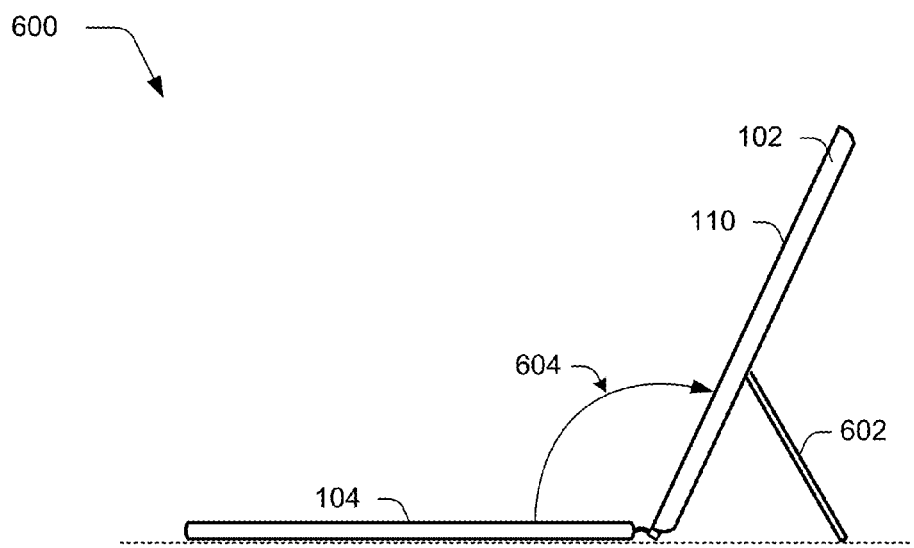
FIG. 6 depicts an example orientation of the accessory device in relation to the computing device in accordance with one or more embodiments.

FIG. 6 illustrates an example orientation 600 of the computing device 102. In the orientation 600, the accessory device 104 is laid flat against a surface and the computing device 102 is disposed at an angle to permit viewing of the display device 110, e.g., such as through use of a kickstand 602 disposed on a rear surface of the computing device 102. The orientation 600 can correspond to a typing arrangement whereby input can be received via the accessory device 104, such as using keys of a keyboard, a track pad, and so forth.

Figure 7:
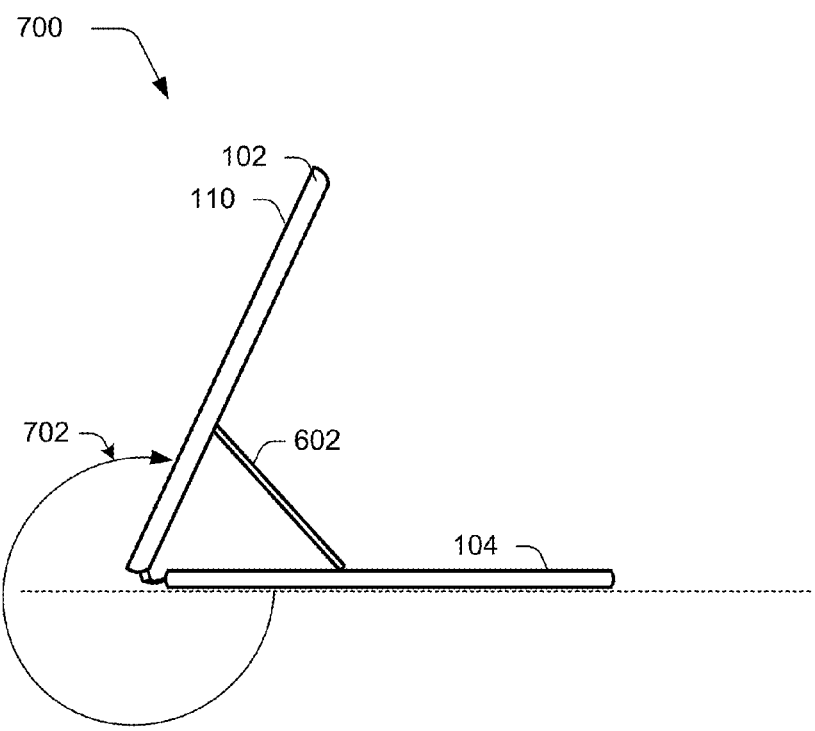
FIG. 7 depicts an example orientation of the accessory device in relation to the computing device in accordance with one or more embodiments.

FIG. 7 illustrates a further example orientation of the computing device 102, generally at 700. In the orientation 700, the computing device 102 is oriented such that the display device 110 faces away from the accessory device 104. In this example, the kickstand 602 can support the computing device 102, such as via contact with a back surface of the accessory device 104. Although not expressly illustrated here, a cover can be employed to cover and protect a front surface of the accessory device 104. In the depicted orientation, an angle 702 between the device and host is established. Various different angles corresponding to different positions/orientation may be established, as discussed above and below.

Figure 8:
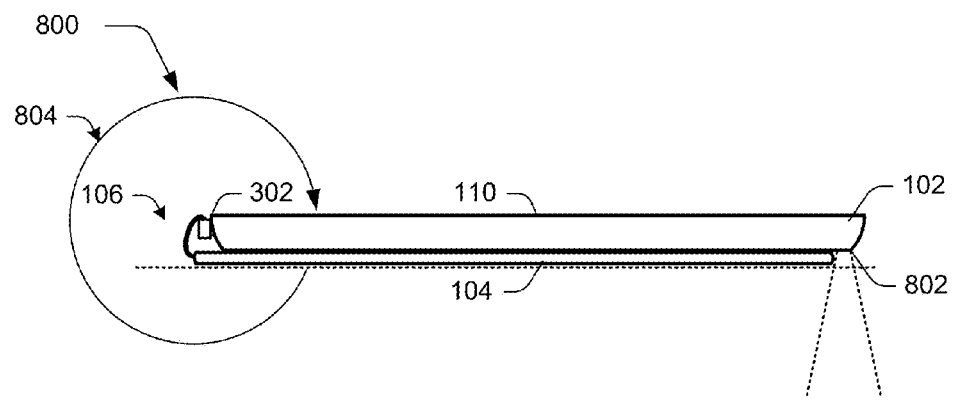
FIG. 8 depicts an example orientation of the accessory device in relation to the computing device in accordance with one or more embodiments.

FIG. 8 illustrates an example orientation 800, in which the accessory device 104 may also be rotated so as to be disposed against a back of the computing device 102, e.g., against a rear housing of the computing device 102 that is disposed opposite the display device 110 on the computing device 102. In this example, through orientation of the connection portion 202 to the computing device 102, the flexible hinge 106 is caused to "wrap around" the connection portion 202 to position the accessory device 104 at the rear of the computing device 102.

This wrapping causes a portion of a rear of the computing device 102 to remain exposed. This may be leveraged for a variety of functionality, such as to permit a camera 802 positioned on the rear of the computing device 102 to be used even though a significant portion of the rear of the computing device 102 is covered by the accessory device 104 in the example orientation 800. Further to the example illustrated in FIG. 8, the display device 110 of the computing device 102 may be determined to be oriented at an angle 804 relative to the accessory device 104. In general, the angle 804 may change as the accessory device 104 is manipulated into different positions. For example, the angle 804 as shown in FIG. 8 can be determined to be approximately 360 degrees. Other orientations may correspond to other angles, and angle ranges may be established and associated with defined modes or states that may trigger different behaviors. Thus, behaviors may be controlled based on the particular mode/state that correspond to the current angle between the host and accessory.

Figure 9:
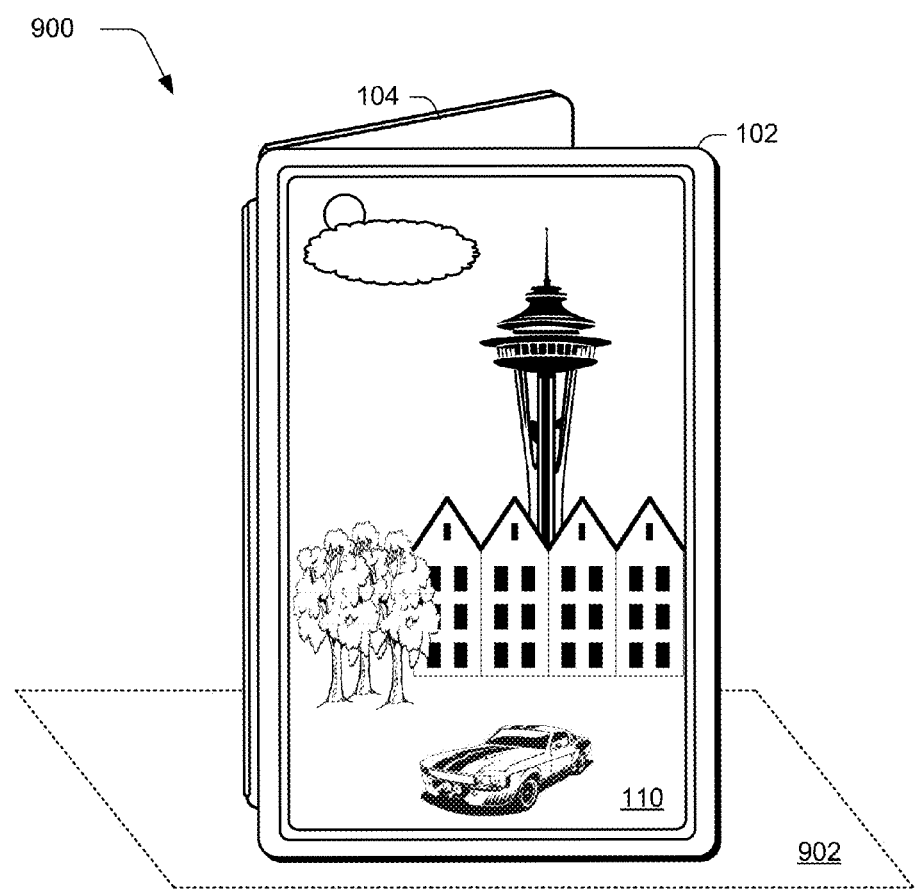
FIG. 9 depicts an example orientation of the accessory device in relation to the computing device in accordance with one or more embodiments.

FIG. 9 illustrates a further example orientation of the computing device 102, generally at 900. In the orientation 900, the computing device 102 is rotated sideways, e.g., in a portrait orientation relative to a surface 902 on which the computing device 102 is disposed. The display device 110 is visible, with the accessory device 104 rotated away from the display device 110. In at least some implementations, a width of the accessory device 104 can be narrower than a width of the computing device 102. Additionally or alternatively, the width of the accessory device 104 can be tapered such that the edge closest to the hinge 106 is wider than the outermost edge. This can enable the face of the display device 110 to recline back in the orientation 900, to provide for a suitable viewing angle.

Figure 10:
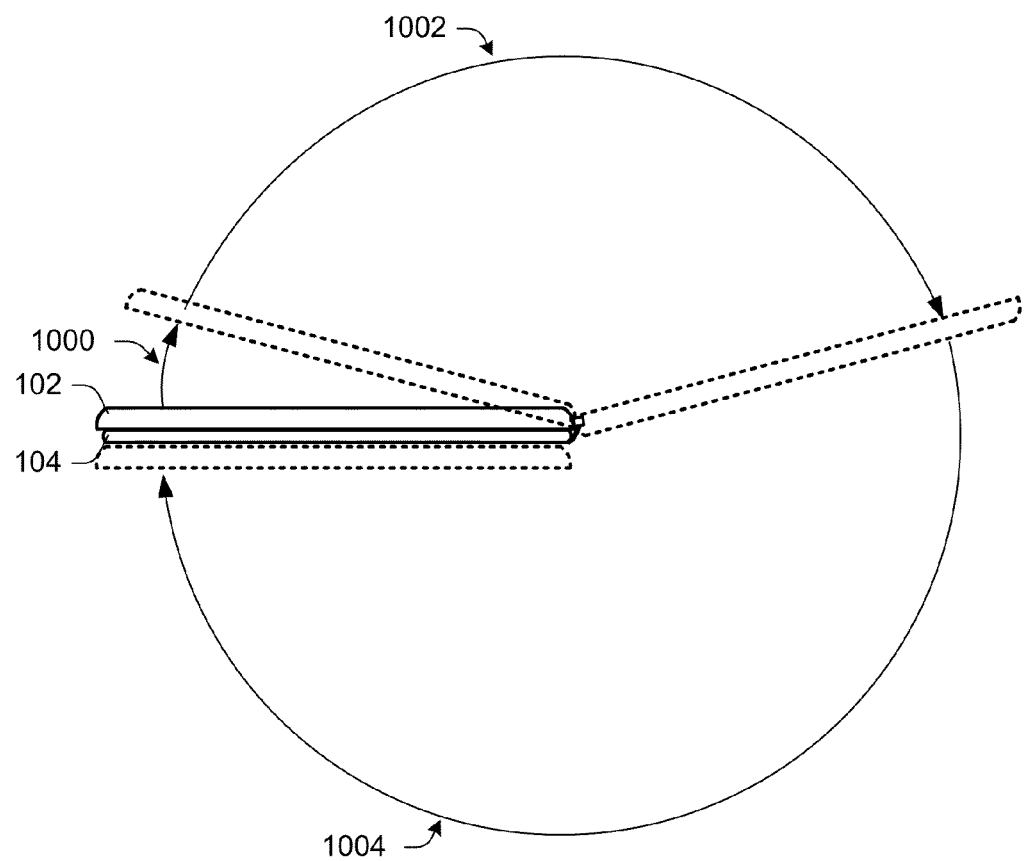
FIG. 10 depicts illustrates some example rotational orientations of the computing device in relation to the input device in accordance with one or more embodiments.

FIG. 10 illustrates that the computing device 102 may be rotated within a variety of different angle ranges with respect to the accessory device 104. As detailed herein, different angle ranges can be associated with different power states, different application states, and so on.

An angle range 1000 is illustrated, which corresponds to a closed position for the computing device 102. Thus, if the computing device 102 is positioned at an angle within the angle range 1000 relative to the accessory device 104, the computing device 102 can be determined to be in a closed position. A closed position can include an associated closed state where various functionalities/behaviors for the computing device 102 and accessory device 104 can be modified accordingly based on the closed state.

Further illustrated is an angle range 1002, which may correspond to a typing orientation for the computing device 102. Thus, if the computing device 102 is positioned at an angle within the angle range 1002 relative to the accessory device 104, the computing device 102 can be determined to be in a typing orientation. Within this orientation, the computing device 102 and/or the accessory device 104 can placed in a typing power state where functionalities/behaviors for the computing device 102 and accessory device 104 can be customized accordingly based on the typing state.

FIG. 10 further illustrates an angle range 1004, which corresponds to a viewing position for the computing device 102. Thus, if the computing device 102 is positioned at an angle within the angle range 1004 relative to the accessory device 104, the computing device 102 can be determined to be in a viewing orientation. In this orientation, functionalities/behaviors for the computing device 102 and accessory device 104 can be controlled accordingly based on the viewing state.

The orientations, angle ranges, power states, and so forth discussed above are presented for purposes of illustration only. It is contemplated that a wide variety of different orientations, device states, and angle ranges may be implemented within the spirit and scope of the claimed embodiments.

Having discussed some example device orientations, consider now some example procedures in accordance with one or more embodiments.

Example Procedures

The following discussion describes sensor fusion algorithm techniques that may be implemented utilizing the previously described systems and devices. Aspects of each of the procedures may be implemented in hardware, firmware, software, or a combination thereof. The procedures are shown as a set of blocks that specify operations performed by one or more devices and are not necessarily limited to the orders shown for performing the operations by the respective blocks. In portions of the following discussion, reference may be made to the example operating environment 100 of FIG. 1, the example devices of FIGS. 2-3, and the example orientation shown in FIGS. 4-10, respectively.

Figure 11:
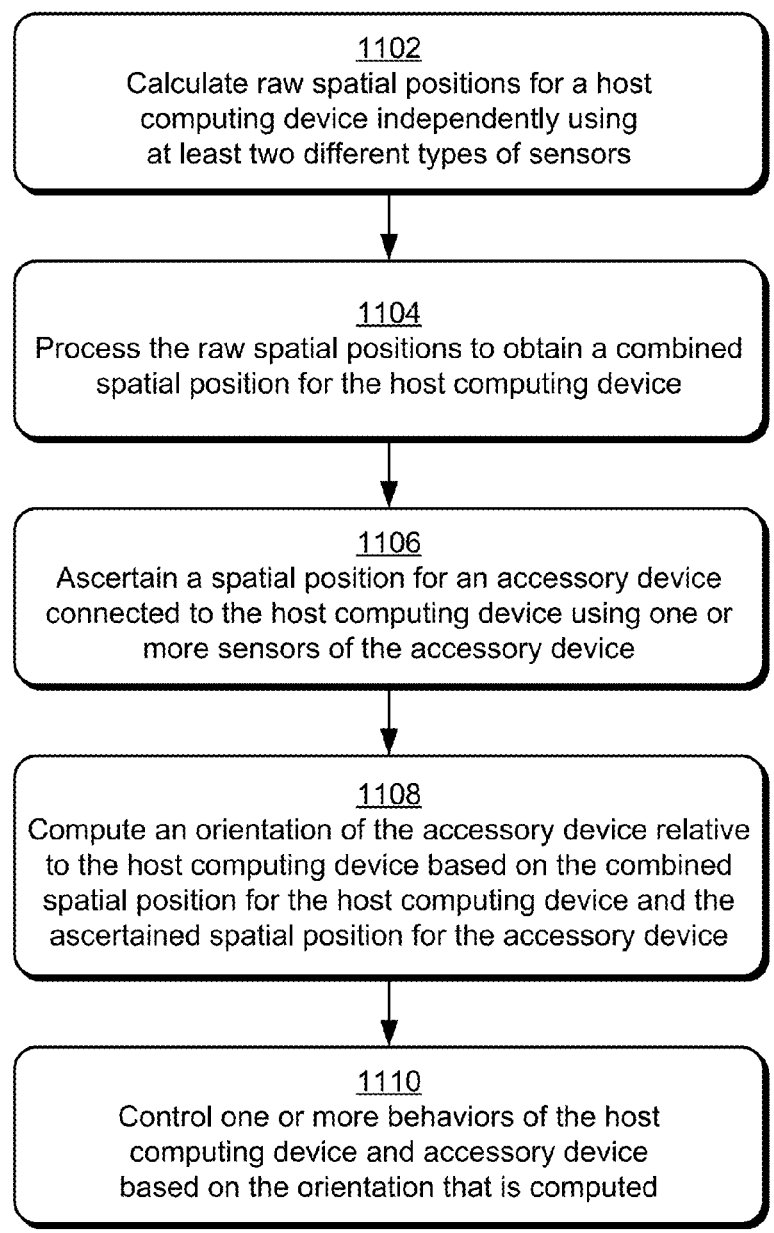
FIG. 11 is a flow diagram that describes an example procedure in accordance with one or more embodiments.

FIG. 11 depicts an example procedure 1100 in which an orientation of an accessory relative to a host is computed. In at least some embodiments, the procedure may be performed by a suitably configured computing device, such as the example computing device 102 of FIG. 2 that includes or otherwise make use of a sensor fusion module 208 and/or behavior module 210.

Raw spatial positions for a host computing device are calculated independently using at least two different types of sensors (block 1102). The raw spatial positions are processed to obtain a combined spatial position for the host computing device (block 1104).

For example, the sensor fusion module 208 may be configured to implement a designated sensor fusion algorithm. Generally, the sensor fusion algorithm is configured to aggregate information from an array of different kinds of host sensors 114 employed by a computing device 102. The aggregation of multiple different sensing techniques and types of sensors may provide improved resolution of positions and may smooth errors that may be introduced by individual techniques and sensors. In at least some embodiments, the sensor fusion algorithm is configured to calculate at least two independent computations of the raw spatial position of the computing device 102 using different respective sensors. Multiple independent computations of the raw position may then be used to produce a combined spatial position. Each of the independent computations may employ one or more of the various types of host sensors 114 described above and below. At least some of the sensors used for different independent computations are of different types. Thus, the sensor fusion algorithm obtains input from a variety of different host sensors 114 and combines this information to resolve the position of the computing device 102.

In one approach, the computing device 102 includes a gyroscope 214 that may be used to obtain one of the independent computations of the raw position. Generally, a gyroscope uses principles of angular momentum to calculate orientation and rotation. The gyroscope 214 can be used to recognize movement within three-dimensional space and may enable determination of position with respect to a reference object/point, such as the earth. Using input obtained from the gyroscope 214, the sensor fusion module 208 may operate to compute a raw spatial position for the computing device. The raw spatial position may be expressed as coordinates in a three dimensional coordinate system defined with x, y, and z axes relative to the reference object/point (e.g., the earth).

In particular, the angular velocity input obtained from the gyroscope can be processed to determine angular positioning of the computing device. Initially, the input from the gyroscope may be filtered to remove a low pass constant offset of the gyroscope. Such a low pass constant offset may be created if the gyroscope is stuck in a non-zero position and is removed to prevent inaccuracy in the computation. The algorithm may integrate over multiple axes of the gyroscope (e.g., x, y, and z axes) to obtain a transform that describes a raw spatial position for the computing device. This processing may involve integrating angular velocity input from the gyroscope through a Runge-Kutta integration algorithm (or other suitable algorithm) to obtain corresponding impulse data. The impulse data may be expressed as quaternions for the different axes, which when multiplied together produce a quaternion that describes a transformation between the computing device 102 and the earth (or other selected reference object/point) with respect to their respective axes/coordinate systems. This provides one independent version of the raw spatial position for the computing device 102.

Another independent computation of the raw spatial position may be obtained using an accelerometer 216 and a magnetometer 218 in combination. Here, the accelerometer 216 is configured as a three axes accelerometer that may be employed to derive two of the degrees of freedom of the device (e.g., position with respect to the x-axis and y-axis). In the low pass, the vector of acceleration is approximately 1 g down pointing to the center of the earth. The components of acceleration measured via the accelerometer 216 may be obtained as distributed across each of the three axes. The components of acceleration can in turn be used to compute angles of the accelerometer/device axes with respect to the low pass vector that points to the center of the earth. This provides two of the three degrees of freedom with respect to tilt or orientation of the device. In particular, the accelerometer processing just described is used to resolve the tilt/orientation of the x-axis and y-axis of the computing device 102.

Now, the magnetometer 218 may be employed to resolve the remaining degree of freedom with respect to tilt/orientation of the device. The magnetometer 218 may be initialized/configured to act like a compass. In this approach, the magnetometer 218 can be used to compute a vector that is parallel to the ground (e.g., the earth's surface). This vector points to magnetic north and can be used to determine rotation of the device with respect to the z-axis. Now, the tilt/orientation of the x-axis and y-axis from the accelerometer and the rotation of the device with respect to the z-axis from the magnetometer 218 may be used to construct another quaternion that describes a transformation between the computing device 102 and the earth (or other selected reference object/point) with respect to their respective axes/coordinate systems. This provides another independent way in which a raw spatial position for the computing device 102 may be obtained. Other examples using different sensors and combination of sensors are contemplated. For example, a global positioning satellite (GPS) radio may be used to provide some positioning data that may be used alone or in combination with other kinds of sensor data to compute the position/orientation of the computing device 102.

Accordingly, at least two different results for the raw spatial position are computed using the foregoing example techniques or other suitable techniques. The sensor fusion algorithm may be further configured to combine multiple independent computations of raw spatial position in various ways. The combining generally involves interpolating between two or more raw spatial positions to reduce or eliminate inaccuracies and/or smooth the results. The interpolation produces a combined spatial position for the computing device that is based on two or more independently obtained raw spatial positions.

By way of example and not limitation, results obtained using a gyroscope may be more precise in the short term relative to other sensors and position determination techniques. However, small integration errors associated with the gyroscope computations may build up over time creating an increasingly larger offset that may result in inaccurate results in the long term. Thus, interpolating the gyroscope results with other independently obtained results can effectively adjust for expected integration errors in the gyroscope results. In one approach, a normalized linear interpolation is employed that may be biased towards the gyroscope results since these results are initially more precise and subject to less noise. Other independent results, such as the results from the accelerometer/magnetometer, may be included in the interpolation to keep the gyroscope results in check and slowly adjust the bias for the combined result away from the gyroscope results and towards the other results over time. This produces a mathematically smooth transformation as the combined result.

A spatial position for an accessory device connected to the host computing device is ascertained using one or more sensors of the accessory device (block 1106). The spatial position for the accessory device 104 may be computed in any suitable way, including but not limited to the techniques described in relation to the computing device 102. Accessory sensors 116 for different accessories may include any of the various types of sensors described herein. Accordingly, different corresponding techniques may be used to ascertain spatial position of the accessory based on appropriate input from one or more accessory sensors 116. Different techniques may also be employed for different accessories based on the types of sensors that are included with the accessory. In general, the sensor fusion module 206 may be configured to obtain input from different sensors of the accessory over a suitable interface with the accessory and compute a corresponding spatial position based on the input.

In one particular example, the sensor fusion module 206 may compute a spatial position using an accelerometer 216 associated with the accessory device 104. In this approach, the accelerometer 216 may be employed to resolve the tilt/orientation with respect to the x-axis and y-axis of the accessory device 104. This may occur in a manner that is comparable to the computation of the same kind of information for the computing device 102 using an associated accelerometer as described above.

In some arrangements, the accessory device 104 may be configured to connect to the computing device 102 using a connection portion 302 that is connectable to an interface of the computing device via a known location. For instance, in the hinge example previously described, at least some information regarding the position of the accessory device may be established based upon the known location and nature of the connection to the host device. Thus, it may be sufficient to use the two degrees of freedom (e.g., x-axis and y-axis position/pitch and roll) for the accessory device 104 in such cases to resolve the position of the accessory relative to the host. It should be noted though that rotation with respect to the z-axis may also be computed for the accessory device 104 in some embodiments, using a magnetometer 218 as discussed previously or using other sensors and techniques. This may be employed in configurations in which an accessory may still be manipulated in three dimensions even when connected to a host device, such as by way of a ball and socket type connection.

An orientation of the accessory device relative to the host computing device is computed based on the combined spatial position for the host computing device and the ascertained spatial position for the accessory device (block 1108). The computed orientation may correspond to any of the different orientations discussed in relation to FIGS. 4-10 as wells as other possible orientations. Here, a comparison can be made between the combined spatial position for the computing device 102 and the ascertained spatial position of the accessory device 104 to derive information regarding the orientation of the device one to another. In particular, the combined spatial position indicates a transformation between how axes in a coordinate system for the computing device 102 are oriented relative to axes associated with a reference coordinate system for the earth or other reference. Similarly, the ascertained spatial position of the accessory device 104 indicates a transformation between how axes in a coordinate system for the accessory device are oriented relative to axes of the reference coordinate system. Accordingly, these two positions may be used to compute a transformation of the accessory device 104 relative to the computing device 102 that is independent of the reference coordinate system.

By way of example, in some cases, the orientation may be defined as an angle of the accessory device 104 with respect the computing device 102 as represented in FIG. 10. As also discussed previously, different angles may be associated with different interaction states, such as the closed state, typing state, and viewing state examples given above. The orientation may alternatively be expressed in another suitable manner, such as using x, y, z coordinates.

Optionally, the computed orientation may be verified using a Hall Effect sensor 220 of the computing device 102. The Hall Effect sensor 220 may be configured to utilize magnetic force to detect proximity between the computing device 102 and the accessory device 104. For example, the Hall Effect sensor 220 may measure proximity based upon one or more magnets that are included with the computing device 102 and/or the accessory device 104. When the computing device 102 is rotated to a closed position, the Hall Effect sensor 220 may be configured to align with and detect a magnet of the accessory device 104. When the computing device 102 is positioned away from the accessory device 104 in an open position, the Hall Effect sensor 220 may be unable to detect the magnet or the detected magnetic force may change as the computing device 102 is rotated at different angles relative to the accessory device 104. The Hall Effect sensor 220 provides another way in which the orientation may be determined. Thus, the Hall Effect sensor 220 may be used as an additional check on whether the orientation computed using other sensors is accurate. This additional check may be made before causing and/or controlling some kinds of behaviors, such as powering down the devices or switching off different components based on orientation.

One or more behaviors of the host computing device and accessory device are controlled based on the orientation that is computed (block 1110). Various behaviors and responsive actions may be driven based on a computed orientation of an accessory with respect to the host. The behavior module 210 may be configured to obtain orientation results from the sensor fusion module 208 and control various behaviors accordingly.

Controlling the behaviors may include at least power management operations for the computing device 102 and/or host device. Generally, power management operations are configured to control power consumption and prolong battery life. For example, the behavior module 210 may cause changes in power modes/states to occur based on particular orientations. This may include toggling the devices and/or selected components on/off according to a determined orientation. For example, in a closed state both the host and accessory may be powered down or placed into a sleep mode. In another example, the accessory may be powered down when the orientation corresponds to a viewing state. The accessory device 104 may also automatically wake-up in particular orientation, such as when a typing state is detected. A variety of other power management examples are also contemplated that may occur in response to a computed orientation.

In another example, controlling the behaviors may include selectively adjusting and/or enabling/disabling different sensors for the device according to the orientation. By way of example, rotation of the accessory fully around to cover the backside of the host may be indicative of a game play state. In this arrangement, it may be likely that an accelerometer 216 may be used for gameplay whereas use of touch functionality for keyboard/typing input from the accessory may be unlikely. According, in this arrangement sensitivity of an accelerometer 216 may be increased/turned-on and touch sensitivity may be decreased or disabled. In a typing state, the opposite may be true and the accelerometer 216 may be disabled or adjusted to less sensitivity and the touch sensitivity may be increased or re-enabled. Thus, sensitivity of sensors may be adjusted and particular sensors may be turned on/off based on orientation. It should be noted that sensors that are controlled may include sensors involved in computation of the orientation as well as other sensors of the host or accessory.

In yet another example, functionality that is activated for the accessory and/or host may be modified based on the orientation. For example, an accessory may be configured to act as game controller when wrapped around to the backside and transform to provide keyboard type inputs when in a typing orientation. In a further example, reading gestures to scroll or turn pages via the accessory may be enabled by input across the accessory device in a viewing orientation and may be disabled for other states/orientation. These kinds of changes in the functionality provided by an accessory may occur by selectively exposing, enabling, configuring or otherwise activating different controls, functions, and gestures according to different orientations.

Comparable changes to activate gestures, touch keys, and other functionality of the host computing device based on the orientation may also occur. For example, gestures for manipulation of media content on the display 110 may be active in some orientations (e.g., viewing state or gaming state) and deactivated in other scenarios. Some additional examples of modifications that may be made to functionality that is activated/available for the computing device based on orientation include selectively enabling/disabling network connections and/or controlling interactions of the host with accessory devices and/or peripheral devices (e.g., printers, streaming media devices, storage devices) based upon the computed orientation.

Additionally, behaviors of applications 112 may also be controlled based on a computed orientation. For example, the behavior module 210 may be configured to selectively activate or deactivate different applications 112 based on the orientation. This may include toggling between applications operating in foreground and background processes, launching and closing particular applications, minimizing/maximizing, and so forth. Applications 112 may also retrieve and/or subscribe to receive updates of computed orientation that the applications may make use of in various ways, some details of which are provided in relation to the following figure. Accordingly, a wide variety of behaviors may be controlled based on a computed orientation, of which the particular behaviors enumerated above are but as few illustrative examples.

Figure 12:
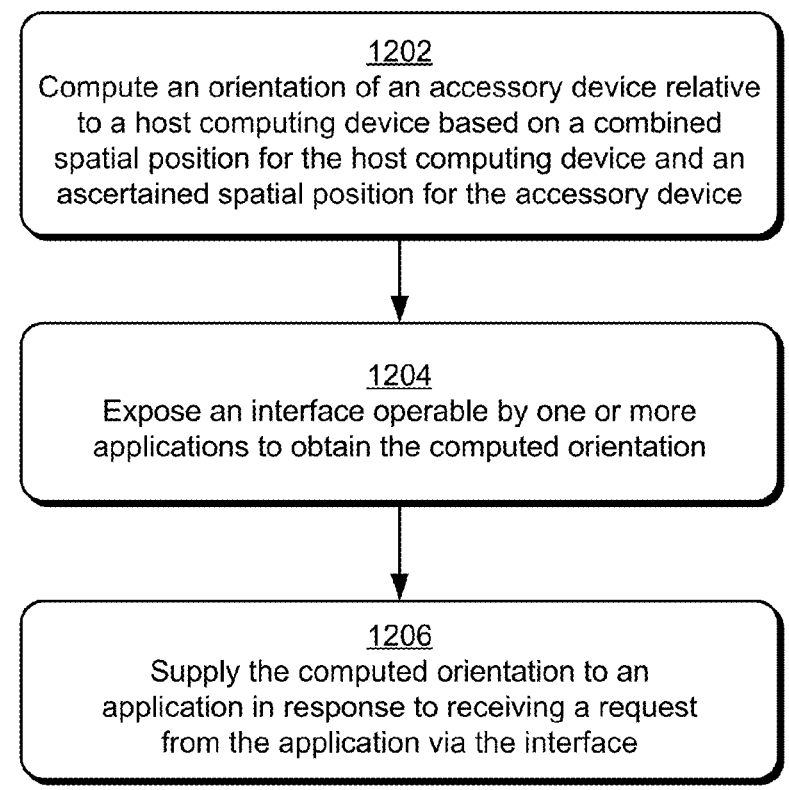
FIG. 12 is a flow diagram that describes an example procedure in accordance with one or more embodiments.

FIG. 12 depicts an example procedure 1200 in which a computed orientation is exposed for use by applications. In at least some embodiments, the procedure may be performed by a suitably configured computing device, such as the example computing device 102 of FIG. 2 that includes or otherwise make use of a sensor fusion application programming interface (API) 212.

An orientation of an accessory device relative to a host computing device is computed based on a combined spatial position for the host computing device and an ascertained spatial position for the accessory device (block 1202). This may occur in accordance with a designated sensor fusion algorithm as discussed in relation to the example procedure 1100 of FIG. 11 above.

An interface is exposed that is operable by one or more applications to obtain the computed orientation (block 1204). The computed orientation is supplied to an application in response to receiving a request from the application via the interface (block 1206). In particular, a computing device 102 may include a sensor fusion application programming interface (API) 212 that is operable to supply computed orientation information to applications 112. In one approach, the sensor fusion API may provide orientation information on demand responsive to individual requests. In addition or alternatively, the sensor fusion API may be configured to facilitate registration of applications 112 to subscribe to receive orientation updates. In response to a request to subscribe, the API may register an application with the sensor fusion module 208 and/or an associated notification system configured to supply notification messages to registered applications when orientation changes occur. The applications 112 may then receive notification messages sent via the notification system that describe updates to the orientation.

The sensor fusion API may supply the orientation and/or related information to application in various formats. For example, the orientation may be in the form of a transform of the accessory device 104 relative to the computing device 102 as computed in the manner described above. In this case, an application may process the supplied orientation information to obtain information in an appropriate format for the application, such as an orientation angle or a defined orientation state corresponding to the computed orientation. In addition or alternatively, the sensor fusion module 208 may operate to compute an orientation state on behalf of applications. Thus, information supplied via the sensor fusion API may include a state name or identifier that may be directly usable by the applications.

Applications 112 may make use of orientation information supplied through the API in various ways. For instance, an application 112 may selectively modify a user interface and/or functionality of the user interface for the application based on the orientation. This may include activating different controls, menus, gestures, and/or input modes for different respective orientations. For example, a navigation menu that appears in one orientation (typing/keyboard input orientation) may disappear in a viewing orientation. Further, an application 112 may be configured to include various modes and switch between the modes based on orientation. For example, a messaging application may switch from a text input mode to a video mode in accordance with the computed orientation. In another example, the application may modify the manner in which particular inputs are interpreted in different orientations. For instance, a button press in a typing orientation may be used for alphanumeric entry whereas the same button may be used for content control functions in a viewing orientation. Other buttons, keys, and other controls may also be selectively enabled or disabled as the orientation changes. A variety of other examples are also contemplated.

Having considered the foregoing example procedures, consider now a discussion of example systems and devices that may be employed to implement aspects of techniques in one or more embodiments.

Example System and Device

Figure 13:
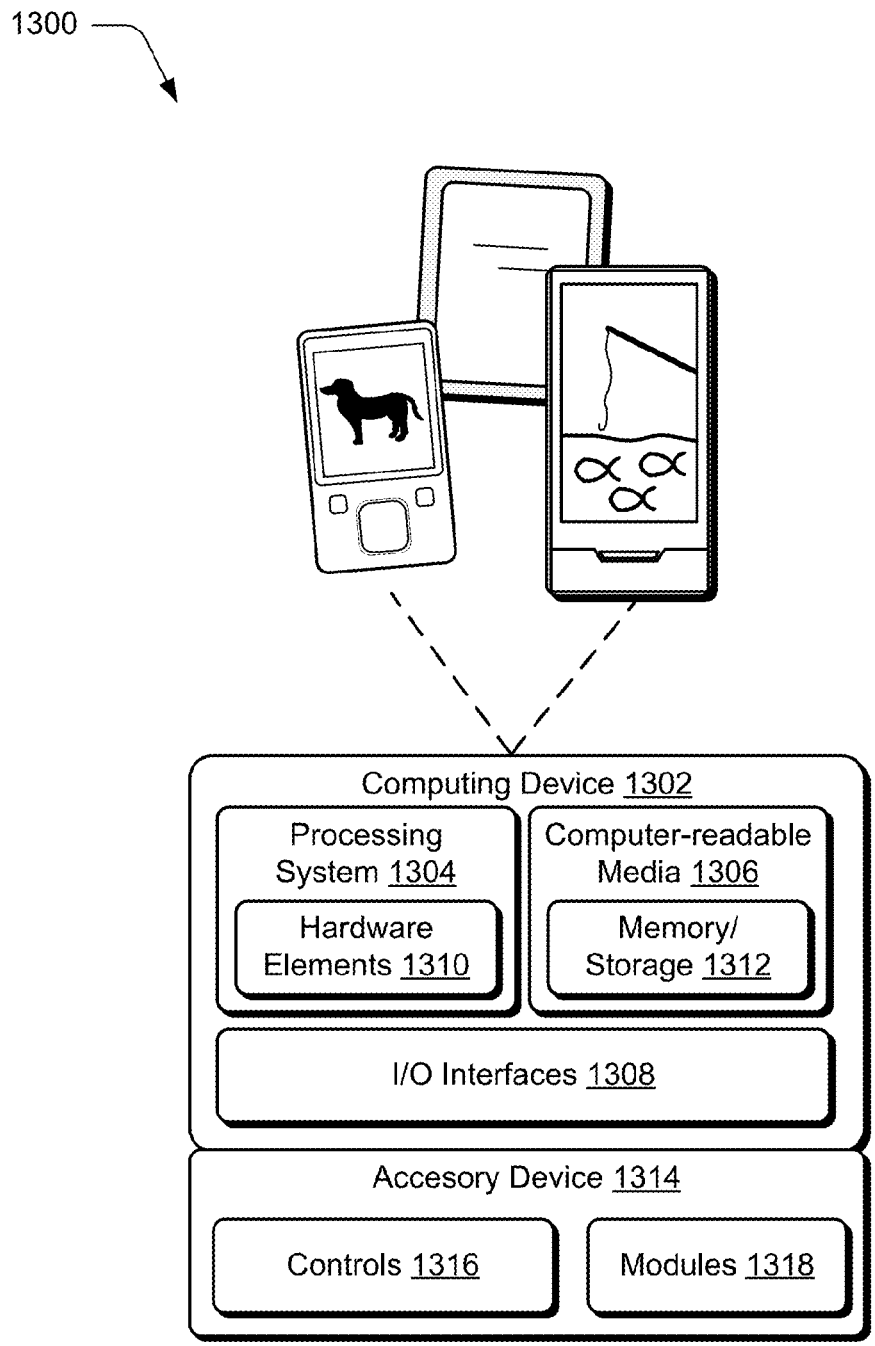
FIG. 13 illustrates an example system including various components of an example device that can be implemented as any type of computing device as described with reference to FIGS. 1-12 to implement embodiments of the techniques described herein.

FIG. 13 illustrates an example system generally at 1300 that includes an example computing device 1302 that is representative of one or more computing systems and/or devices that may implement the various techniques described herein. The computing device 1302 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1302 as illustrated includes a processing system 1304, one or more computer-readable media 1306, and one or more I/O interface 1308 that are communicatively coupled, one to another. Although not shown, the computing device 1302 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1304 is representative of functionality to perform one or more operations using hardware. Accordingly, the processing system 1304 is illustrated as including hardware element 1310 that may be configured as processors, functional blocks, and so forth. This may include implementation in hardware as an application specific integrated circuit or other logic device formed using one or more semiconductors. The hardware elements 1310 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1306 is illustrated as including memory/storage 1312. The memory/storage 1312 represents memory/storage capacity associated with one or more computer-readable media. The memory/storage component 1312 may include volatile media (such as random access memory (RAM)) and/or nonvolatile media (such as read only memory (ROM), Flash memory, optical disks, magnetic disks, and so forth). The memory/storage component 1312 may include fixed media (e.g., RAM, ROM, a fixed hard drive, and so on) as well as removable media (e.g., Flash memory, a removable hard drive, an optical disc, and so forth). The computer-readable media 1306 may be configured in a variety of other ways as further described below.

Input/output interface(s) 1308 are representative of functionality to allow a user to enter commands and information to computing device 1302, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1302 may be configured in a variety of ways to support user interaction.

The computing device 1302 is further illustrated as being communicatively and physically coupled to an accessory device 1314 that is physically and communicatively removable from the computing device 1302. In this way, a variety of different accessory devices may be coupled to the computing device 1302 having a wide variety of configurations to support a wide variety of functionality. In this example, the accessory device 1314 includes one or more controls 1316, which may be configured as press-sensitive keys, mechanically switched keys, buttons, and so forth.

The accessory device 1314 is further illustrated as including one or more modules 1318 that may be configured to support a variety of functionality. The one or more modules 1318, for instance, may be configured to process analog and/or digital signals received from the controls 1316 to determine whether an input was intended, determine whether an input is indicative of resting pressure, support authentication of the accessory device 1314 for operation with the computing device 1302, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1302. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1302, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1310 and computer-readable media 1306 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, microcontroller devices, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1310. The computing device 1302 may be configured to implement particular instructions and/or functions corresponding to the software and/or hardware modules. Accordingly, implementation of a module that is executable by the computing device 1302 as software may be achieved at least partially in hardware, e.g., through use of computer-readable storage media and/or hardware elements 1310 of the processing system 1304. The instructions and/or functions may be executable/operable by one or more articles of manufacture (for example, one or more computing devices 1302 and/or processing systems 1304) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A method implemented by a host computing device comprising:
    calculating multiple raw spatial positions for the host computing device independently using at least two different types of sensors of the host computing device;
    processing the multiple raw spatial positions to obtain a combined spatial position for the host computing device;
    ascertaining a spatial position for an accessory device connected to the host computing device using one or more sensors of the accessory device; and
    computing an orientation of the accessory device relative to the host computing device based on the combined spatial position for the host computing device and the ascertained spatial position for the accessory device.

2. A method as described in claim 1, further comprising exposing the computed orientation for use by one or more applications of the host computing device via an application programming interface (API).

3. A method as described in claim 1, wherein calculating the multiple raw spatial positions for the host computing device comprises using a gyroscope to compute one of the multiple raw spatial positions.

4. A method as described in claim 1, wherein calculating the multiple raw spatial positions for the host computing device comprises using an accelerometer and a magnetometer in combination to compute one of the multiple raw spatial positions.

5. A method as described in claim 1, wherein the spatial position for the accessory device is ascertained via an accelerometer of the accessory device.

6. A method as described in claim 1, wherein the different types of sensors include a gyroscope, an accelerometer, and a magnetometer of the host computing device.

7. A method as described in claim 1, wherein processing the multiple raw spatial positions to obtain the combined spatial position comprises interpolating between the multiple raw spatial positions to reduce inaccuracy of the combined spatial position.

8. A method as described in claim 1, wherein the calculating, processing ascertaining, and computing are performed via one or more microcontrollers of the host computing device configured to implement a sensor fusion module at least partially in hardware.

9. A method as described in claim 1, further comprising controlling one or more behaviors of the host computing device based on the orientation that is computed.

10. A method as described in claim 9, wherein controlling the one or more behaviors of the host computing device comprises selectively adjusting sensitivity of one or more sensors based on the orientation that is computed.

11. A method as described in claim 9, wherein controlling the one or more behaviors of the host computing device comprises selectively activating or deactivating one or more applications based on the orientation that is computed.

12. A method as described in claim 1, further comprising controlling one or more behaviors of the accessory device based on the orientation that is computed.

13. A method as described in claim 12, wherein controlling the one or more behaviors of the accessory device comprises modifying functionality that is activated for the accessory device based on the orientation that is computed.

14. A method as described in claim 12, wherein controlling the one or more behaviors of the accessory device comprises selectively enabling or disabling one or more sensors of the accessory device based on the orientation that is computed.

15. A host computing device comprising:
    one or more hardware elements;
    a sensor fusion module implemented at least partially via the hardware elements and configured to perform operations including:
    computing an orientation of an accessory device relative to the host computing device to which the accessory device is connected based upon:

a combined spatial position for the host computing device obtained by interpolation of at least two independent raw spatial positions for the host computing device calculated using multiple sensors of the host computing device; and a spatial position for the accessory device ascertained using one or more sensors of the accessory device; and controlling one or more behaviors of the host computing device and the accessory device based upon the orientation that is computed.

16. The host computing device as described in claim 15, wherein the multiple sensors of the host computing device comprise at least two different types of sensors.

17. The host computing device as described in claim 15, wherein the sensor fusion module is further configured to perform operations including:
   calculating one of the multiple raw spatial positions using a gyroscope of the host computing device;
   calculating another one of the multiple raw spatial positions using an accelerometer and magnetometer of the host computing device in combination; and
   ascertaining the spatial position for the accessory device using an accelerometer of the accessory device.

18. The host computing device as described in claim 15, wherein controlling the one or more behaviors comprises performing power management operations to switch power states of the host computing device and the accessory device based on the orientation that is computed.

19. A method implemented by a host computing device comprising:
   computing an orientation of an accessory device relative to a host computing device to which the accessory device is attached based on at least two independent computations of a spatial position for the host computing device that are calculated using an array of sensors for the host computing device and an ascertained spatial position for the accessory device ascertained using one or more sensors of the accessory device;
   exposing an application programming interface (API) operable by one or more applications to obtain the computed orientation; and
   supplying the computed orientation to an application in response to receiving a request from the application via the API.

20. The method as described in claim 19, wherein the application programming interface (API) is further operable by the one or more applications to register with a notification system to receive notification messages regarding updates to the computed orientation that are sent by the notification system to registered applications.

* * * * *